US009202751B2

(12) United States Patent
Wei et al.

(10) Patent No.: US 9,202,751 B2
(45) Date of Patent: Dec. 1, 2015

(54) TRANSISTOR CONTACTS SELF-ALIGNED IN TWO DIMENSIONS

(71) Applicant: GLOBALFOUNDRIES Inc., Grand Cayman (KY)

(72) Inventors: Andy Chih-Hung Wei, Queensbury, NY (US); Guillaume Bouche, Albany, NY (US); Mark A. Zaleski, Galway, NY (US); Tuhin Guha Neogi, Clifton Park, NY (US); Jason E. Stephens, Menands, NY (US); Jongwook Kye, Pleasanton, CA (US); Jia Zeng, Sunnyvale, CA (US)

(73) Assignee: GlobalFoundries Inc., Grand Cayman (KY)

( * ) Notice: Subject to any disclaimer, the term of this patent is extended or adjusted under 35 U.S.C. 154(b) by 85 days.

(21) Appl. No.: 14/246,476

(22) Filed: Apr. 7, 2014

(65) Prior Publication Data

US 2015/0287636 A1  Oct. 8, 2015

(51) Int. Cl.
| | |
|---|---|
| *H01L 21/338* | (2006.01) |
| *H01L 21/768* | (2006.01) |
| *H01L 27/088* | (2006.01) |
| *H01L 21/8234* | (2006.01) |
| *H01L 23/532* | (2006.01) |
| *H01L 21/02* | (2006.01) |
| *H01L 21/285* | (2006.01) |
| *H01L 21/8238* | (2006.01) |
| *H01L 27/092* | (2006.01) |
| *H01L 29/66* | (2006.01) |

(52) U.S. Cl.
CPC ...... *H01L 21/76897* (2013.01); *H01L 21/0217* (2013.01); *H01L 21/02164* (2013.01); *H01L 21/28568* (2013.01); *H01L 21/76834* (2013.01); *H01L 21/823475* (2013.01); *H01L 21/823878* (2013.01); *H01L 23/5329* (2013.01); *H01L 23/53228* (2013.01); *H01L 23/53257* (2013.01); *H01L 27/088* (2013.01); *H01L 27/092* (2013.01); *H01L 29/66462* (2013.01)

(58) Field of Classification Search
CPC .................. H01L 2924/00; H01L 23/5226
See application file for complete search history.

(56) References Cited

U.S. PATENT DOCUMENTS

| 4,047,284 A * | 9/1977 | Spadea ........................ 438/218 |
| 4,141,022 A * | 2/1979 | Sigg et al. .................... 257/384 |
| 7,563,701 B2 | 7/2009 | Chang et al. |
| 2010/0264550 A1 | 10/2010 | Yang |

* cited by examiner

*Primary Examiner* — Zandra Smith
*Assistant Examiner* — Andre' C Stevenson
(74) *Attorney, Agent, or Firm* — Williams Morgan, P.C.

(57) ABSTRACT

Embodiments of the present invention provide an improved semiconductor structure and methods of fabrication that provide transistor contacts that are self-aligned in two dimensions. Two different capping layers are used, each being comprised of a different material. The two capping layers are selectively etchable to each other. One capping layer is used for gate coverage while the other capping layer is used for source/drain coverage. Selective etch processes open the desired gates and source/drains, while block masks are used to cover elements that are not part of the connection scheme. A metallization line (layer) is deposited, making contact with the open elements to provide electrical connectivity between them.

20 Claims, 10 Drawing Sheets

TRANSISTOR CONTACTS SELF-ALIGNED IN TWO DIMENSIONS

FIELD OF THE INVENTION

The present invention relates generally to semiconductor fabrication, and more particularly, to structures for transistor contacts and methods of fabrication.

BACKGROUND

As technology progresses, the manufacture of electronic devices must be improved to meet the trend of mobile, lightweight, and efficient electronic devices. In addition to reducing the size of the semiconductor devices, miniaturization can also be achieved by reducing the distance between semiconductor devices. However, process problems remain that limit the amount of miniaturization that can be achieved. In particular, the contacts which interface the devices to metallization layers can pose numerous challenges. It is therefore desirable to have improved contacts and methods of fabrication.

SUMMARY

Embodiments of the present invention provide an improved semiconductor structure and methods of fabrication that provide transistor contacts that are self-aligned in two dimensions. Two different capping layers are used, each being comprised of a different material. The two capping layers are selectively etchable to each other. One capping layer is used for gate coverage while the other capping layer is used for source/drain coverage. Selective etch processes open the desired gates and source/drains, while block masks are used to cover elements that are not part of the connection scheme. A metallization line (layer) is deposited, making contact with the open elements to provide electrical connectivity between them. This serves to improve middle-of-line (MOL) density, which is often a limiting factor with scalability.

In a first aspect, embodiments of the present invention provide a method of forming a semiconductor structure comprising: covering a plurality of transistor gates with a first capping layer; covering a plurality of source/drain contact areas with a second capping layer; forming a first mask over the semiconductor structure, wherein the first mask exposes a plurality of gate contact locations; removing the first capping layer from the plurality of gate contact locations; forming a second mask over the semiconductor structure, wherein the second mask exposes a plurality of source/drain contact locations; removing the second capping layer from the plurality of source/drain contact locations; and depositing a metallization layer over the exposed source/drain contact locations and exposed gate contact locations.

In a second aspect, embodiments of the present invention provide a method of forming a semiconductor structure comprising: covering a plurality of transistor gates with a first capping layer; covering a plurality of source/drain contact areas with a second capping layer; forming a first mask over the semiconductor structure, wherein the first mask exposes a plurality of gate contact locations; removing the first capping layer from the plurality of gate contact locations; forming a second mask over the semiconductor structure, wherein the second mask exposes a plurality of source/drain contact locations; removing the second capping layer from the plurality of source/drain contact locations; and depositing a metallization line over the exposed source/drain contact locations and exposed gate contact locations, wherein the first capping layer comprises silicon oxide and the second capping layer comprises silicon nitride.

In a third aspect, embodiments of the present invention provide a semiconductor structure comprising: a plurality of transistor gates; a plurality of transistor source/drain contact areas; a first capping layer disposed on a subset of the plurality of transistor gates; a second capping layer disposed on a subset of the plurality of transistor source/drain contact areas; and a metallization layer disposed on the first capping layer and second capping layer.

BRIEF DESCRIPTION OF THE DRAWINGS

The accompanying drawings, which are incorporated in and constitute a part of this specification, illustrate several embodiments of the present teachings and, together with the description, serve to explain the principles of the present teachings.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

Often, similar elements may be referred to by similar numbers in various figures (FIGs) of the drawing, in which case typically the last two significant digits may be the same, the most significant digit being the number of the drawing figure (FIG). Furthermore, for clarity, some reference numbers may be omitted in certain drawings.

DETAILED DESCRIPTION

It will be appreciated that this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art. The terminology used herein is for the purpose of describing particular embodiments only and is not intended to be limiting of this disclosure. For example, as used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

The terms "overlying" or "atop", "positioned on" or "positioned atop", "underlying", "beneath" or "below" mean that a first element, such as a first structure (e.g., a first layer), is present on a second element, such as a second structure (e.g., a second layer), wherein intervening elements, such as an interface structure (e.g., interface layer), may be present between the first element and the second element.

Figure 1:
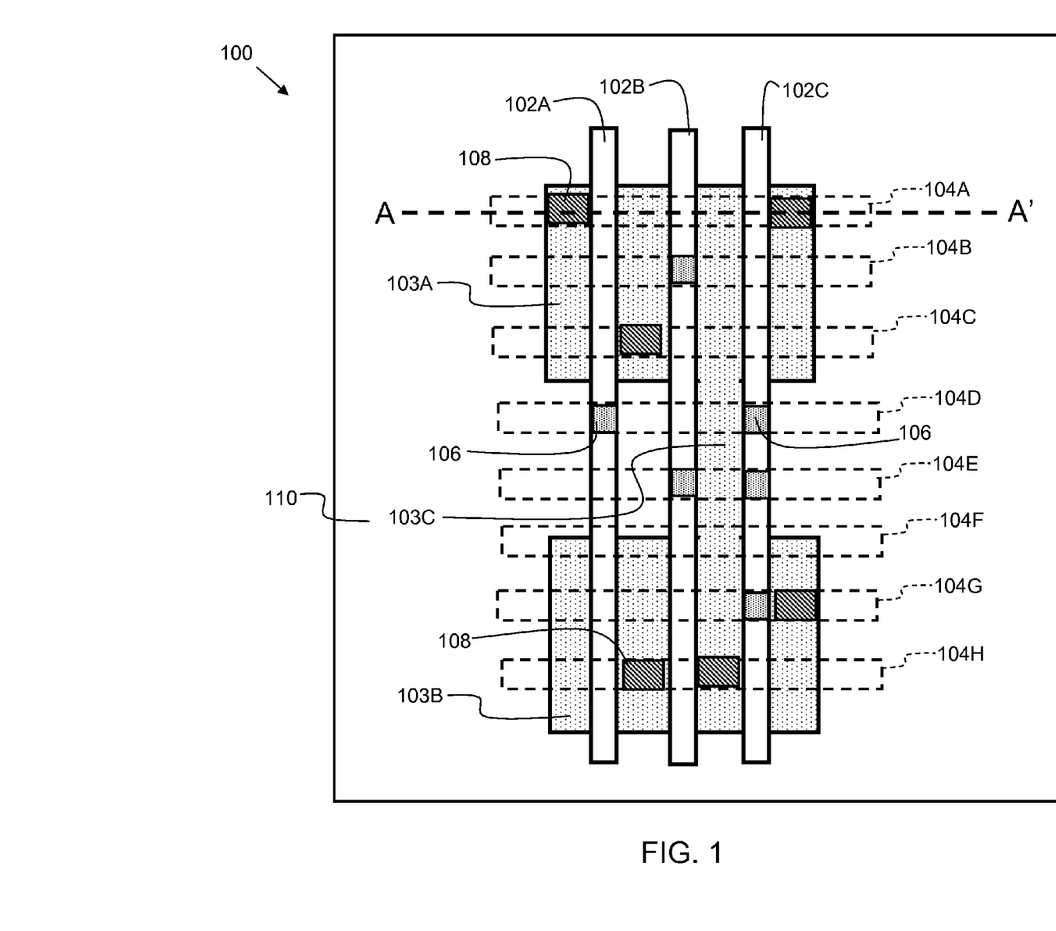
FIG. 1 shows a top down view of a semiconductor structure in accordance with illustrative embodiments.

FIG. 1 shows a top down view of a semiconductor structure 100 in accordance with illustrative embodiments. Semiconductor structure 100 comprises multiple gates 102A, 102B and 102C (referred to generally as 102). The gates 102A, 102B, and 102C may be comprised of metal, and may be formed using a replacement metal gate (RMG) process. The gates are disposed on a source/drain contact layer 103. Source/drain contact layer 103 may sometimes be referred to as a "TS" layer. The source/drain contact layer 103 is disposed over a semiconductor substrate 110, which has a plurality of transistor sources and drains formed thereon. The sources and drains are often structurally identical, and throughout this disclosure, the term "source/drain" is used to refer to an active semiconductor area serving as either a source or a drain of a transistor. The transistor may be a fin type field effect transistor (finFET), where the source/drain is part of a semiconductor fin that is oriented perpendicularly to the gates 102. A plurality of metallization lines (104A-104H, and referred to generally as 104) are also oriented perpendicularly to, and disposed above, the gates 102.

For a given circuit design, it is desirable to have contacts to various source/drains and gates of the different transistors in order to implement various circuits, such as logic circuits, SRAM cells, and the like. The contacts may connect to various back end of line (BEOL) metallization layers and via layers to implement the desired connections. In some cases, it is desirable to connect elements of nearby transistors to each other, such as a source/drain of one transistor to a source/drain or gate of another transistor, for example.

Embodiments of the present invention simplify the process of contact formation by exploiting selective etch properties of dissimilar capping materials, and also make use of the intersection of the lowest metallization layer (often referred to as "M0") with the gates 102 and source/drain contact layer 103. In embodiments, two different capping layers are used: a first capping layer for the source/drain contact layer, and a second capping layer for the gates. Various gates and source/drains are opened, while a block mask protects gates and source/drains that are to remain covered. The lithographic requirements for the block masks are considerably reduced compared to a traditional manufacturing method of forming individual contacts through lithographic methods. This is especially the case as critical dimensions continue to decrease with each generation of semiconductor fabrication technology. Embodiments of the present invention provide source/drain and gate contacts that are self-aligned in two dimensions (both the X and Y dimensions), simplifying the semiconductor fabrication process and also improving product yield by reducing the risk of defects such as contact shorts between gates and adjacent source/drains.

As shown in FIG. 1, a plurality of source/drain contacts (indicated generally as 108) and a plurality of gate contacts (indicated generally as 106) are specified at points where the metallization lines 104 intersect the gates 102 and source/drain contact layer regions 103A-C. Region 103A is a source/drain contact layer region on a first polarity of CMOS (i.e. PMOS), and region 103B is source/drain contact layer region on the opposite polarity, following the example, NMOS. In embodiments, source/drain contact layer region 103C may be a "passthrough" interconnection of NMOS and PMOS transistors comprised of the same source/drain contact layer as regions 103A and 103B. The passthrough interconnection may connect a plurality of NMOS field effect transistors to a plurality of PMOS field effect transistors. Through the processes described in the subsequent figures, contacts are made only where needed, thus enabling the desired connectivity. Many different connection schemes are possible. For example, referring to metallization line 104A, a source/drain contact adjacent to gate 102A is connected to a source/drain contact adjacent to gate 102C. Along metallization line 104B, there is a gate contact formed on gate 102B, while gates 102A and 102C do not have a gate contact formed thereon. Along metal line 104C, there is a single source/drain contact. Along metallization line 104D, there are two gate contacts connected to each other. The gate 102A is connected to gate 102C while not connecting to the S/D contact "passthrough" 103C. Along metallization line 104E, gate 102B is connected to gate 102C, also not connecting to the S/D contact "passthrough" 103C. Along metallization line 104F, no contacts are formed. All source/drain contact areas and gates remain covered by capping layers. Along metallization line 104G, a so-called gate-S/D stitch structure is formed, connecting a gate of a transistor to one of its source/drain contacts. Along metallization line 104H, a connection is formed between two neighboring source/drain contacts, while not forming contact with the intervening gate 102B. Those skilled in the art will recognize that these are merely examples, and in practice, a metallization line may span many more gates than what is illustrated in FIG. 1.

Figure 2:
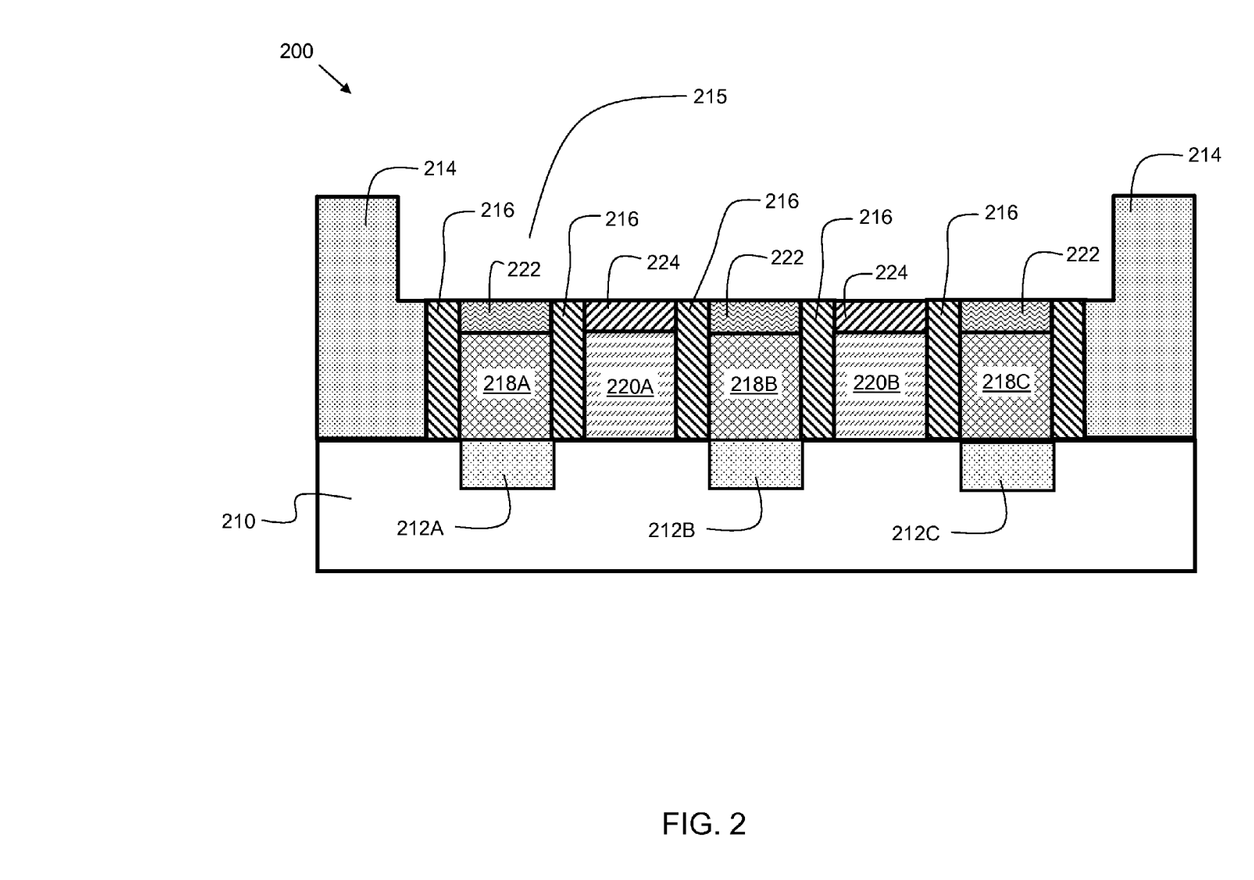
FIG. 2 shows a cross-section view of a semiconductor structure at a starting point for illustrative embodiments.

FIG. 2 shows a cross-section view (as viewed along line A-A' of FIG. 1) of a semiconductor structure 200 at a starting point for illustrative embodiments. Semiconductor structure 200 comprises a semiconductor substrate 210. In embodiments, semiconductor substrate 210 may comprise a silicon substrate. The semiconductor substrate 210 may be a bulk silicon substrate, or may be semiconductor-on-insulator (SOI) substrate. A plurality of gates (220A and 220B) are formed on the semiconductor substrate 210. In embodiments, the gates 220A and 220B are comprised of metal and formed by a replacement metal gate (RMG) process. In embodiments, the gates 220A and 220B may be comprised of tungsten. Source/drain regions 212A, 212B, and 212C are formed adjacent to the gates 220A and 220B. The source/drain contact areas 218A, 218B, and 218C are formed over the source/drain regions 212A, 212B, and 212C, respectively. One capping layer 224 is disposed over each of the gates 220A and 220B. Another capping layer 222 is disposed over the source/drain contact areas 218A, 218B, and 218C. The capping layer 222 and capping layer 224 are different materials, and preferably are selective to each other with etch processes. In some embodiments, capping layer 222 may be comprised of an oxide, such as silicon oxide, while capping layer 224 is comprised of a nitride, such as silicon nitride. In other embodiments, capping layer 224 may be comprised of an oxide, such as silicon oxide, while capping layer 222 is comprised of a nitride, such as silicon nitride. A field insulator (dielectric) 214 creates a metallization line cavity 215, where a metallization line is subsequently deposited. In embodiments, the field insulator 214 may be comprised of silicon oxycarbide (SiOC). Preferably, the field insulator 214 is such that both the capping layer 222 and the capping layer 224 can be etched without substantial removal of the field insulator. In some embodiments, the field insulator may be adjacent to the source/drain contact areas and gates. Optionally, as shown in FIG. 2, spacers 216 may be disposed adjacent to the gates (220A, 220B), and may also be disposed adjacent to the source/drain contact areas (218A, 218B, and 218C). Preferably, the material for the spacers 216 is such that both the capping layer 222 and the capping layer 224 can be etched without substantial removal of the spacers. In some embodiments, the spacers 216 are comprised of silicon oxycarbon nitride (SiOCN) or may be silicon oxycarbide (SiOC).

Figure 3:
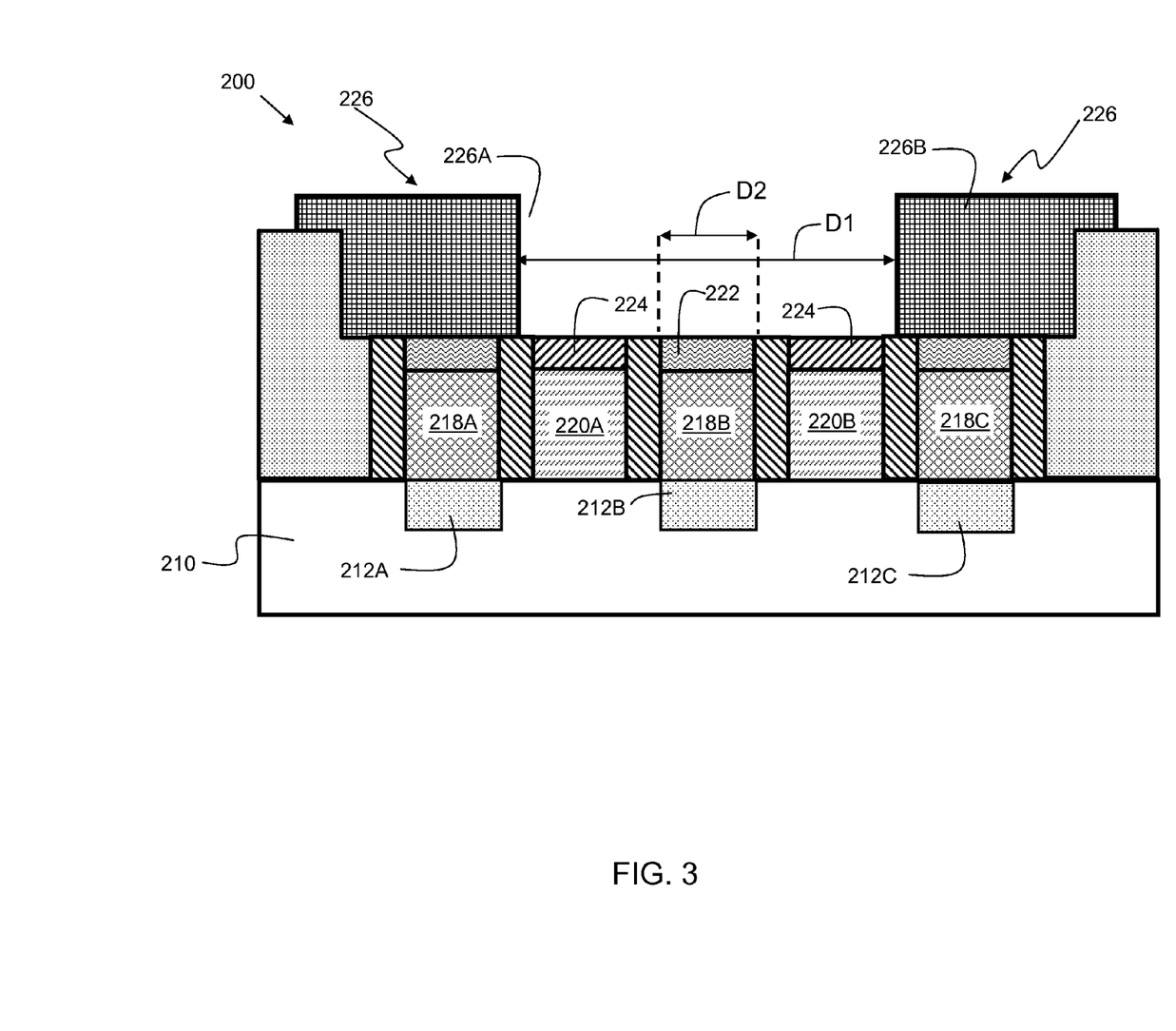
FIG. 3 shows a cross-section view of a semiconductor structure after a subsequent process step of depositing a first mask layer in accordance with illustrative embodiments.

FIG. 3 shows a cross-section view of semiconductor structure 200 after a subsequent process step of depositing a first mask layer 226 in accordance with illustrative embodiments. In embodiments, first mask layer 226 may be comprised of photoresist. In other embodiments, a hardmask may be used for mask layer 226. As shown in FIG. 3, an exemplary deposition pattern of the first mask 226 comprises two regions (226A, and 226B) having a distance D1 between them, which exposes the location of source/drain contact area 218B. In this example, it is desirable to open the source/drain contact area 218B, having a distance D2, while not opening the adjacent gates 220A or 220B. The lithographic requirements for the masking layer are such that the distance D1 has a fairly wide range and can range from just slightly larger than distance D2, up to a distance of D1 as shown in FIG. 1. In some embodiments, D2 may range from about 15 nanometers to about 40 nanometers, and D1 may range from about D2 plus 5 nanometers, to about 3 times D2. Hence, there is a wide tolerance range for D1, which makes the lithography for the mask layer 226 relatively straightforward to execute.

Figure 4:
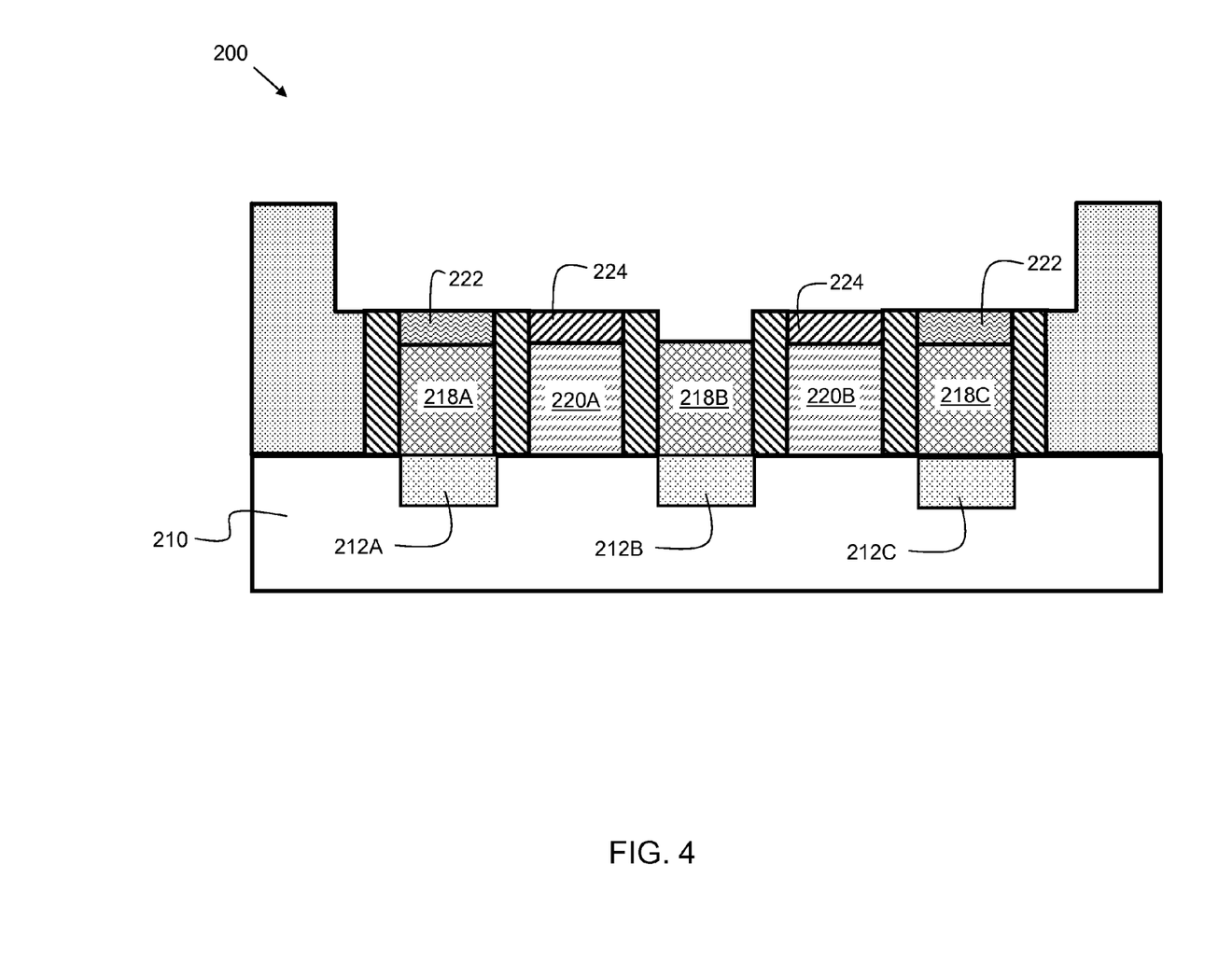
FIG. 4 shows a cross-section view of a semiconductor structure after a subsequent process step of exposing a source/drain contact area in accordance with illustrative embodiments.

FIG. 4 shows a cross-section view of semiconductor structure 200 after a subsequent process step of exposing a source/drain contact area in accordance with illustrative embodiments. Source/drain contact area 218B is exposed using a selective etch process that only removes the capping layer 222 over the source/drain contact areas, but does not remove the capping layer 224 that is disposed over the gates (220A, 220B). In embodiments, the capping layer over source/drain contact area 218B may be removed using a selective reactive ion etch (RIE) process. In another embodiment, an isotropic "digital" etch technique, such as a SiCoNi etch may be used, depending on the material used for the capping layer. After the capping layer is removed, the first mask layer (226 of FIG. 3) is also removed.

Figure 5:
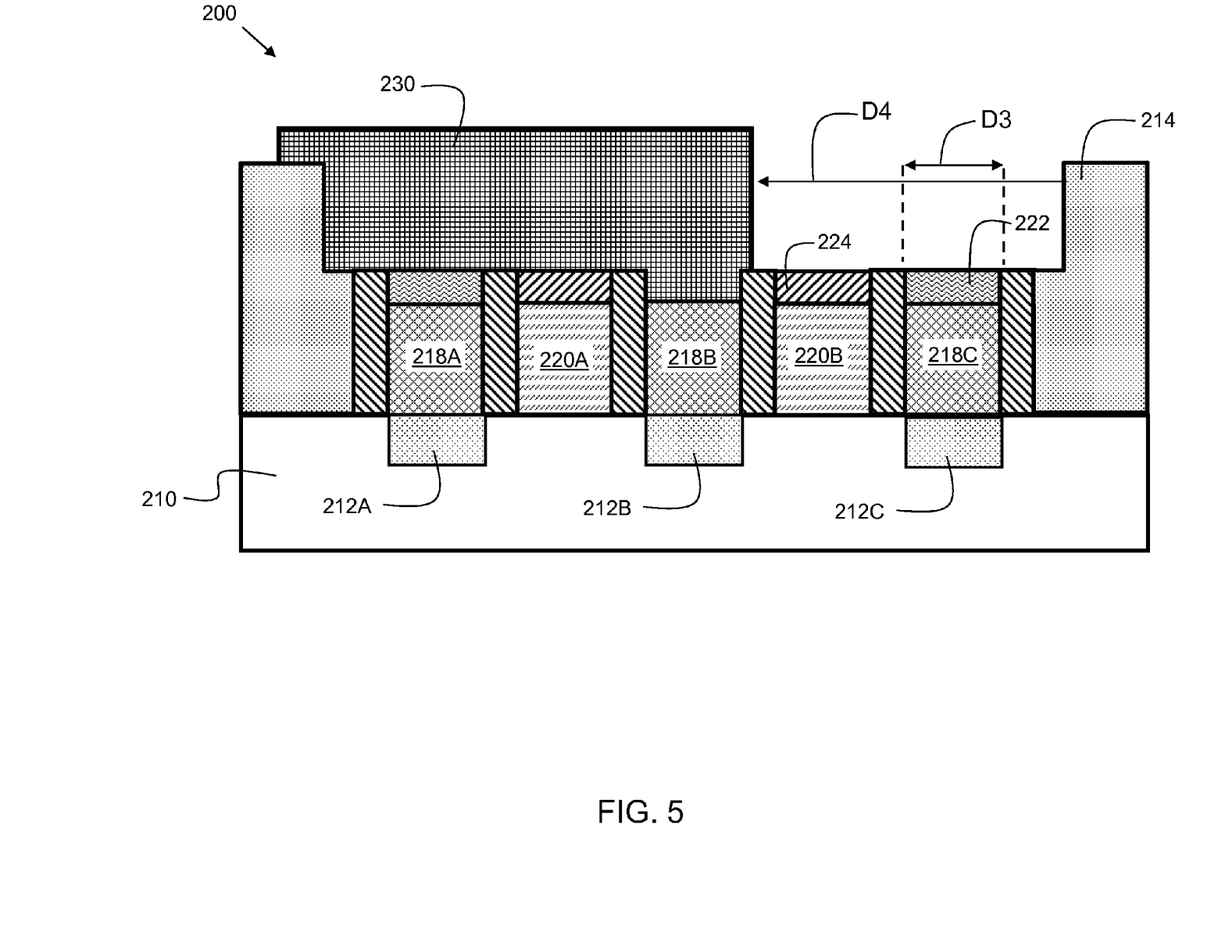
FIG. 5 shows a cross-section view of a semiconductor structure after a subsequent process step of depositing a second mask layer in accordance with illustrative embodiments.

FIG. 5 shows a cross-section view of semiconductor structure 200 after a subsequent process step of depositing a second mask layer 230 in accordance with illustrative embodiments. In this example, it is desirable to open the gate 218C, having a distance D3, while not opening the adjacent gate 220B. Hence, the distance D4, between the field insulator 214 and the second mask layer 230 can be much larger than D3. In some embodiments, distance D3 may range from about 15 nanometers to about 40 nanometers, and D4 may range from about D3 plus 5 nanometers, to about 3 times D3. Hence, there is a wide tolerance range for D4, which makes the lithography for the mask layer 230 relatively straightforward to execute.

Figure 6:
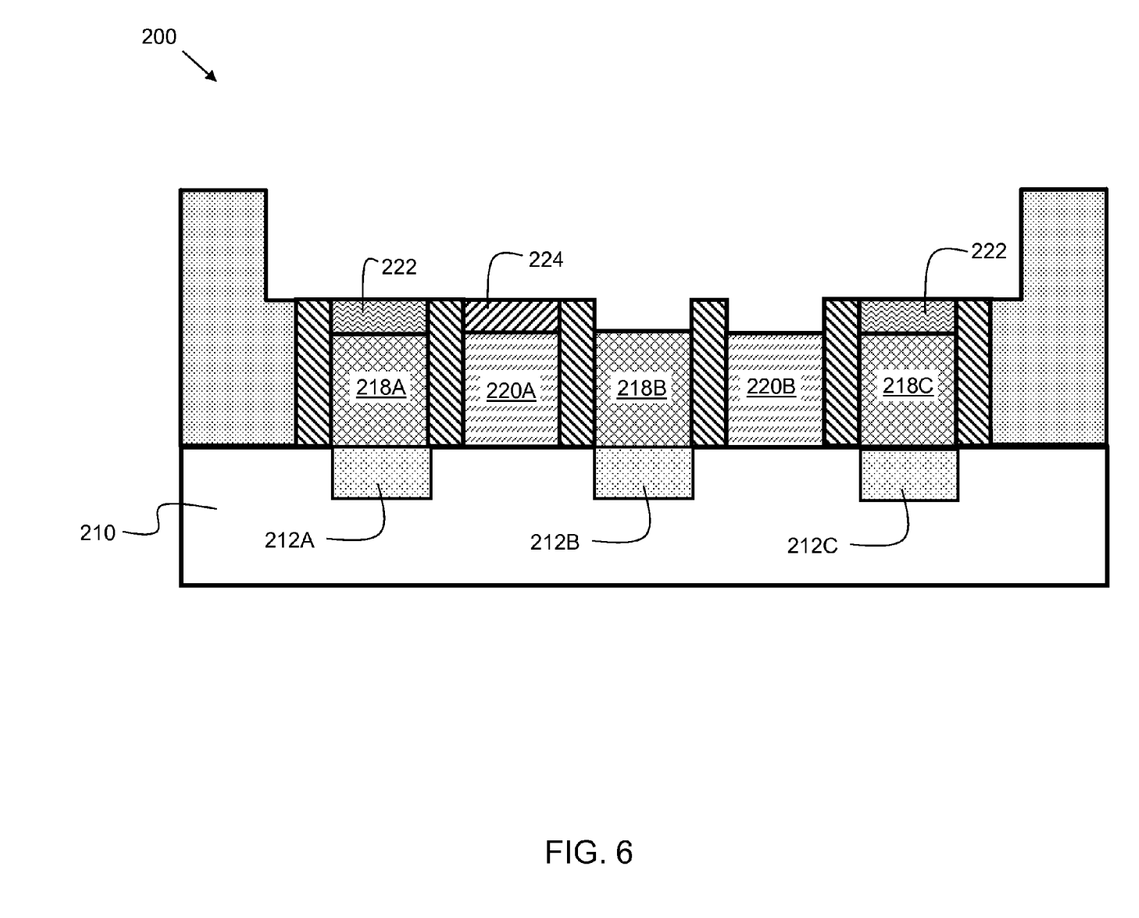
FIG. 6 shows a cross-section view of a semiconductor structure after a subsequent process step of exposing a transistor gate in accordance with illustrative embodiments.

FIG. 6 shows a cross-section view of semiconductor structure 200 after a subsequent process step of exposing a transistor gate in accordance with illustrative embodiments. In embodiments, the capping layer over gate 220B may be removed using a selective reactive ion etch (RIE) process. In another embodiment, an isotropic etch, such as a SiCoNi etch may be used, depending on the material used for the capping layer. After the capping layer is removed, the second mask layer (230 of FIG. 5) is also removed.

Figure 7:
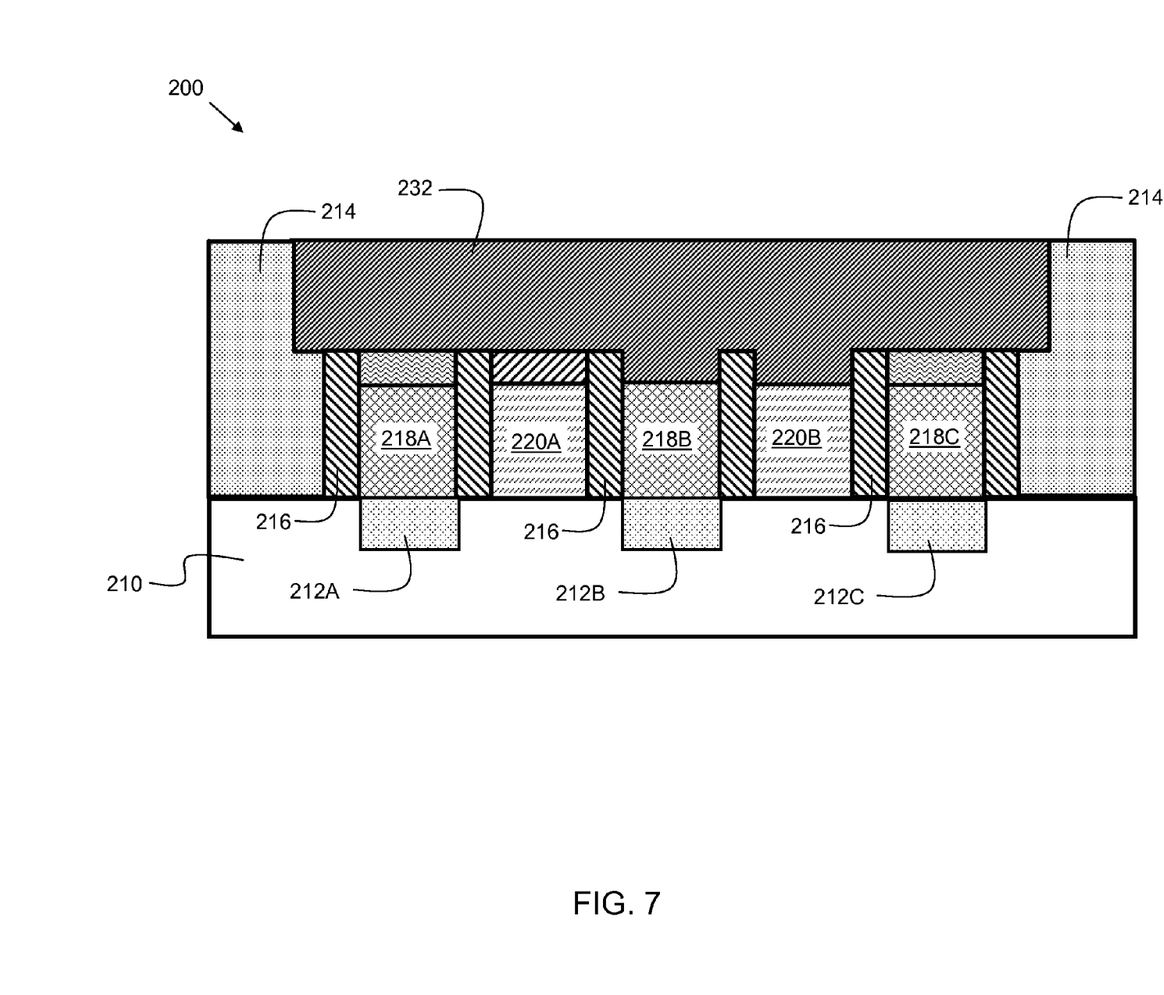
FIG. 7 shows a cross-section view of a semiconductor structure after a subsequent process step of depositing a metallization line in accordance with illustrative embodiments.

FIG. 7 shows a cross-section view of semiconductor structure 200 after a subsequent process step of depositing a metallization line 232 in accordance with illustrative embodiments. The metallization line 232 is bounded by the field insulator 214. In embodiments, metallization line 232 may be comprised of tungsten, copper, or aluminum. Other materials are possible. The metallization line 232 may be deposited using a chemical vapor deposition (CVD), physical vapor deposition (PVD), or electroplating process. As a result of the deposition of metallization line 232, the gate 220B is in electrical contact with source/drain contact area 218B. This results in a "gate-source/drain stitch" similar to what is shown along metallization line 104G of FIG. 1. The contacts for gates and source/drain contact areas are formed by the intersection of the metallization line and the gates and source/drain contact areas that have been opened (had their respective capping layers removed). The contacts to the gates and source/drains are self-aligned in two dimensions, allowing for increased circuit density and improved product yield. As an additional benefit, device performance is increased because the connection path is shorter, reducing resistance, as compared with traditional designs that utilize a via to reach a metallization line. In this case, the metallization line is directly on the exposed (opened) gates and exposed (opened) source/drain contact regions. In embodiments, a subset of the gates and source/drain contact regions remain covered with a capping layer. The metallization line (layer) is also in direct physical contact with the first and second capping layers for these non-exposed (non-opened) elements (source/drain contact areas and gates).

Figure 8:
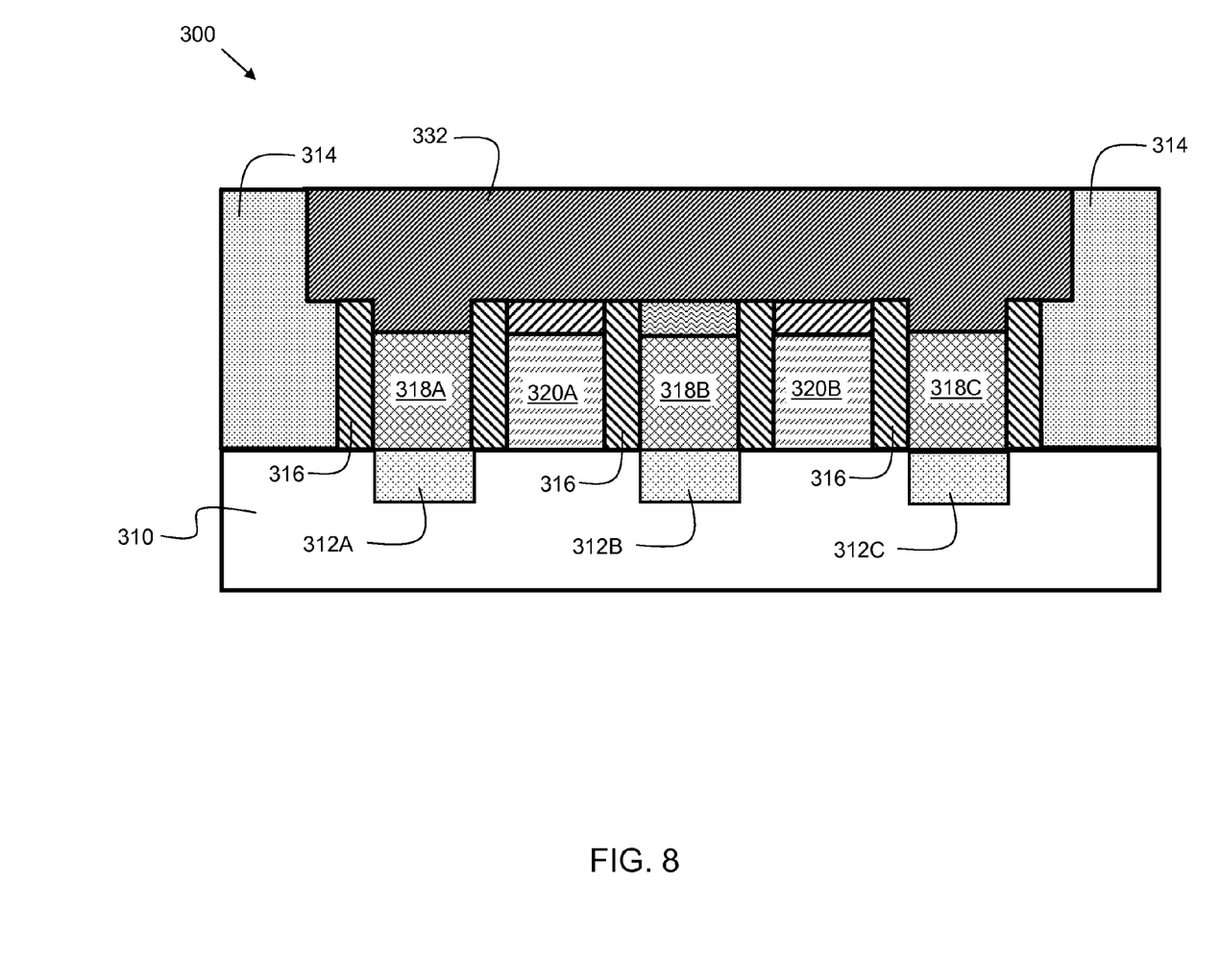
FIG. 8 shows a cross-section view of a semiconductor structure forming a connection between two source/drain contact areas in accordance with alternative illustrative embodiments.

FIG. 8 shows a cross-section view of a semiconductor structure 300 forming a connection between two source/drain contact areas in accordance with alternative illustrative embodiments. As stated previously, similar elements may be referred to by similar numbers in various figures (FIGs) of the drawing, in which case typically the last two significant digits may be the same, the most significant digit being the number of the drawing figure (FIG). For example, semiconductor substrate 310 of FIG. 3 is similar to semiconductor substrate 210 of FIG. 2. In this example, metallization line 322 provides electrical connectivity between source/drain region 312A and source/drain region 312C, passing over gates 320A and 320B, and source drain/region 318B. Similar to the process shown in FIGS. 1-7, by selecting the appropriate first and second mask patterns, the desired connection points have the capping layer removed to enable connectivity by the metallization line 332.

Figure 9:
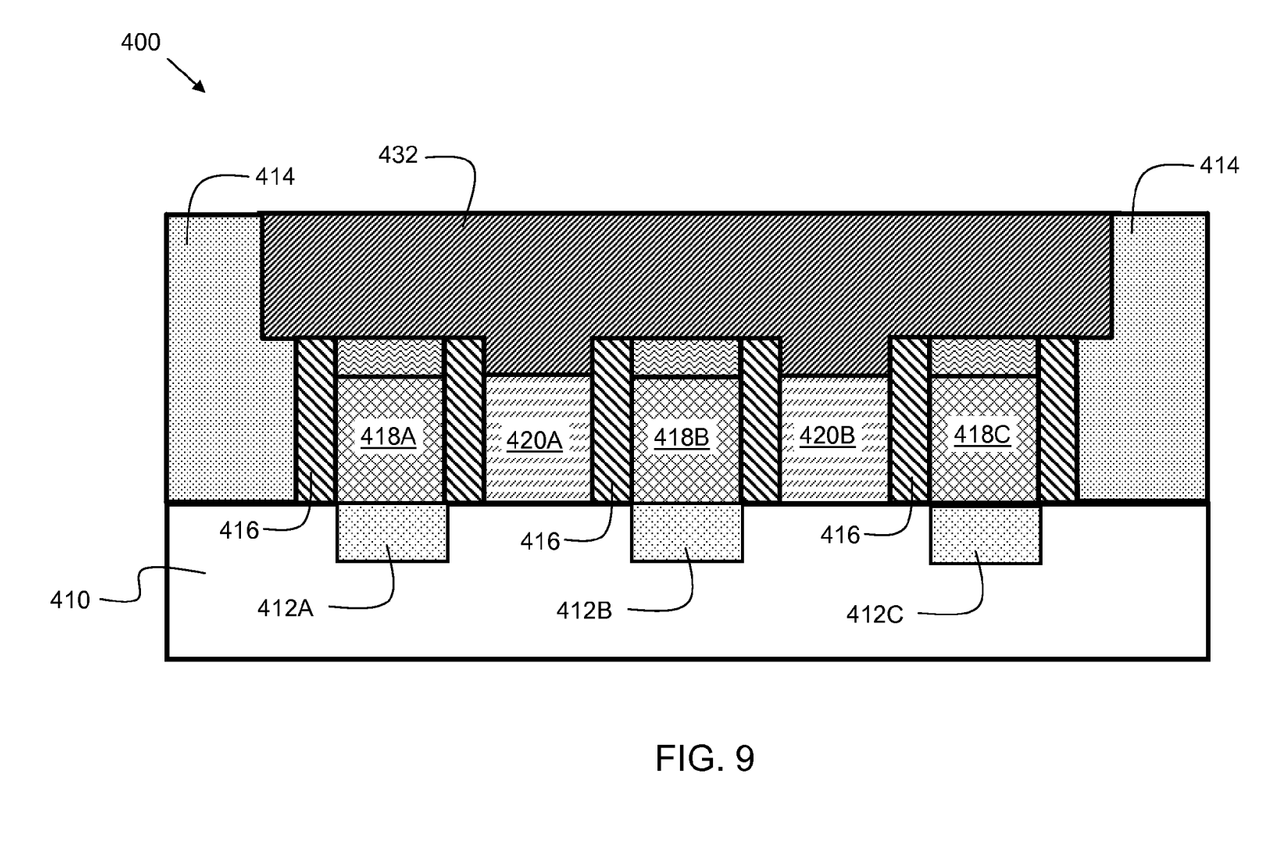
FIG. 9 shows a cross-section view of a semiconductor structure forming a connection between two transistor regions in accordance with alternative illustrative embodiments.

FIG. 9 shows a cross-section view of a semiconductor structure 400 forming a connection between two transistor regions in accordance with alternative illustrative embodiments. In this example, metallization line 432 provides electrical connectivity between gate 420A and gate 420B, passing over source drain/region 418B. Similar to the process shown in FIGS. 1-7, by selecting the appropriate first and second mask patterns, the desired connection points have the capping layer removed to enable connectivity by the metallization line 422.

Figure 10:
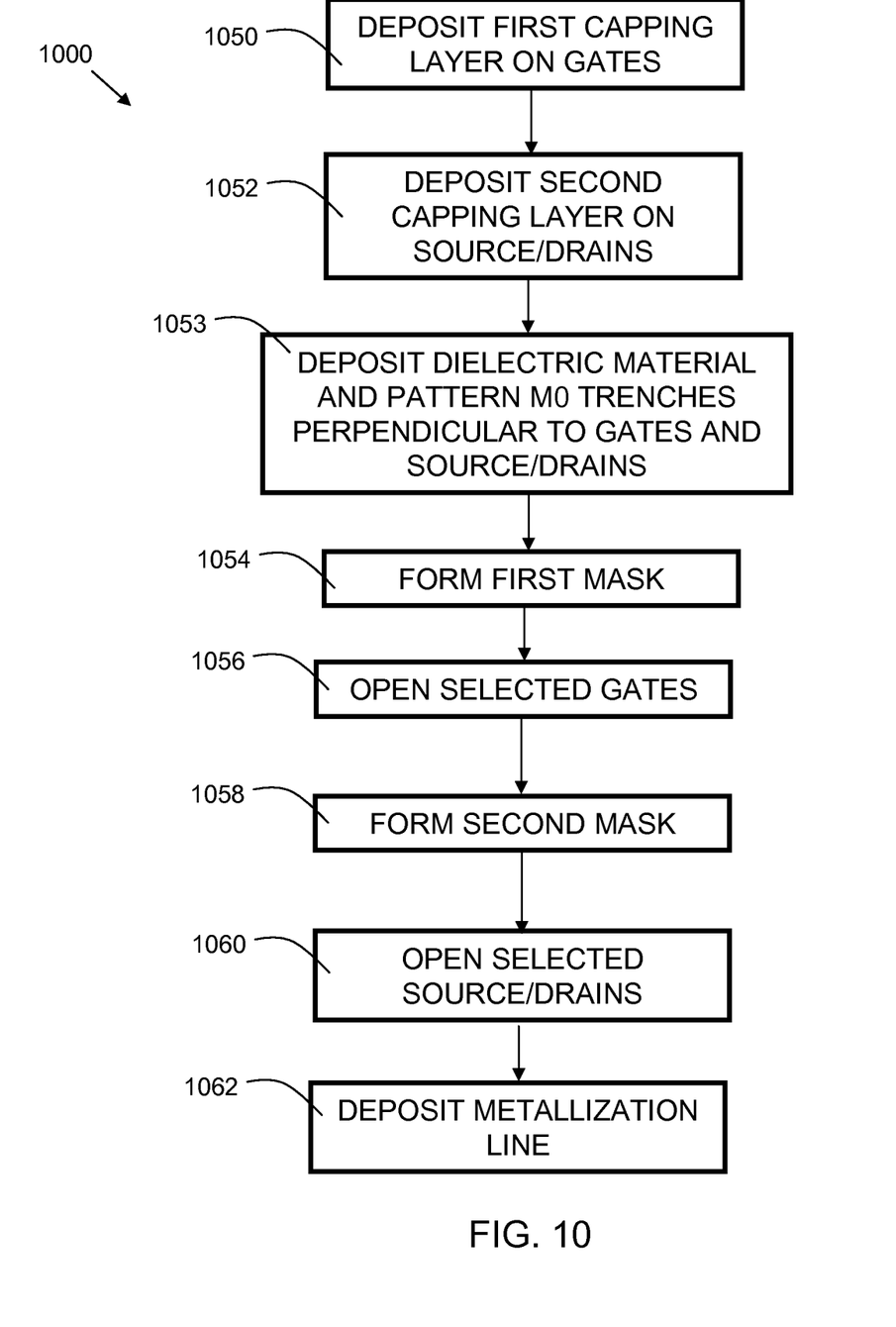
FIG. 10 is a flowchart indicating process steps for embodiments of the present invention.

FIG. 10 is a flowchart 1000 indicating process steps for embodiments of the present invention. In process step 1050, a first capping layer is deposited over the transistor gates (e.g., 224 of FIG. 2). In process step 1052, a second capping layer is deposited over the source/drain contact areas (e.g., 222 of FIG. 2). While flowchart 1000 shows depositing a capping layer over the gates, followed by deposition of a different capping layer over the source/drain contact areas, embodiments of the present invention may reverse the order, and deposit a capping material over the source/drain contact areas first, followed by a capping layer of a different material being deposited over the gates. In process step 1053, a dielectric layer is deposited and a metal trench is opened, exposing the gate and source/drain capping layers. In process step 1054, a first mask layer is formed (see 226 of FIG. 3). The first mask layer covers gates that are not supposed to be opened. In process step 1056, selected gates (not covered by the first mask layer) are opened by removing the capping layer above those gates (e.g., 220B of FIG. 6). In process step 1058, a second mask is formed (see 230 of FIG. 5). The second mask layer covers source/drain contact areas that are not supposed to be opened. In process step 1060, selected source/drain contact areas (not covered by the second mask layer) are opened by removing the capping layer above those source/drain contact areas (e.g., 218B of FIG. 4). In process step 1062, a metallization line is deposited, which provides electrical connectivity between the opened elements (gates and source/drains). While flowchart 1000 shows opening gates first, followed by opening source/drain contact areas, embodiments of the present invention may reverse the order, and open source/drain contact areas first, followed by opening of gates.

As can now be appreciated, embodiments of the present invention provide an improved semiconductor structure and methods of fabrication, that provide transistor contacts that are self-aligned in two dimensions. This serves to improve middle-of-line (MOL) density, which is often a limiting factor with scalability.

While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

1. A method of forming a semiconductor structure comprising:
    covering a plurality of transistor gates with a first capping layer;
    covering a plurality of source/drain contact areas with a second capping layer;
    forming a first mask over the semiconductor structure, wherein the first mask exposes a plurality of gate contact locations;
    removing the first capping layer from the plurality of gate contact locations;
    forming a second mask over the semiconductor structure, wherein the second mask exposes a plurality of source/drain contact locations;
    removing the second capping layer from the plurality of source/drain contact locations; and
    depositing a metallization layer over the exposed source/drain contact locations and exposed gate contact locations.

2. The method of claim 1, wherein covering a plurality of transistor gates with a first capping layer comprises depositing silicon nitride.

3. The method of claim 2, wherein covering a plurality of source/drain contact areas with a second capping layer comprises depositing silicon oxide.

4. The method of claim 1, wherein depositing a metallization layer comprises depositing tungsten.

5. The method of claim 1, wherein depositing a metallization layer comprises depositing copper.

6. The method of claim 1, further comprising forming a gate-SD stitch structure connecting one of the plurality of transistor gates to an adjacent source/drain contact area.

7. The method of claim 1, further comprising connecting a first transistor gate of the plurality of transistor gates to a second transistor gate of the plurality of transistor gates.

8. The method of claim 1, further comprising connecting a first source/drain contact area of the plurality of source/drain contact areas to a second source/drain contact area of the plurality of source/drain contact areas.

9. A method of forming a semiconductor structure comprising:
    covering a plurality of transistor gates with a first capping layer;
    covering a plurality of source/drain contact areas with a second capping layer;
    forming a first mask over the semiconductor structure, wherein the first mask exposes a plurality of gate contact locations;
    removing the first capping layer from the plurality of gate contact locations;
    forming a second mask over the semiconductor structure, wherein the second mask exposes a plurality of source/drain contact locations;
    removing the second capping layer from the plurality of source/drain contact locations; and
    depositing a metallization line over the exposed source/drain contact locations and exposed gate contact locations, wherein the first capping layer comprises silicon oxide and the second capping layer comprises silicon nitride.

10. The method of claim 9, wherein depositing a metallization line comprises depositing tungsten.

11. The method of claim 9, further comprising forming a gate-SD stitch structure connecting one of the plurality of transistor gates to an adjacent source/drain contact area.

12. The method of claim 9, further comprising connecting a first transistor gate of the plurality of transistor gates to a second transistor gate of the plurality of transistor gates.

13. The method of claim 9, further comprising connecting a first source/drain contact area of the plurality of source/drain contact areas to a second source/drain contact area of the plurality of source/drain contact areas.

14. The method of claim 9, further comprising connecting a first source/drain contact layer region comprising NMOS transistors to a second source/drain contact layer region comprising PMOS transistors using a passthrough interconnection.

15. A semiconductor structure comprising: a plurality of transistor gates; a plurality of transistor source/drain contact areas; a first capping layer disposed on a subset of the plurality of transistor gates; a second capping layer disposed on a subset of the plurality of transistor source/drain contact areas; and a metallization layer disposed on the first capping layer and second capping layer and a dielectric region comprised of silicon oxycarbide, and a plurality of spacers comprised of a material selected from the group consisting of silicon oxycarbide and silicon oxycarbonitride.

16. The semiconductor structure of claim 15, wherein the metallization layer is in electrical contact with at least one transistor gate of the plurality of transistor gates.

17. The semiconductor structure of claim 15, wherein the metallization layer is in electrical contact with at least one source/drain contact area of the plurality of transistor source/drain contact areas.

18. The semiconductor structure of claim 15, wherein the dielectric region bounds the metallization layer.

19. The semiconductor structure of claim 18, wherein the plurality of spacers are adjacent to each transistor gate of the plurality of transistor gates.

20. The semiconductor structure of claim 19, wherein the first capping layer is comprised of silicon nitride, and the second capping layer is comprised of silicon oxide.

* * * * *